(12) United States Patent
Chen et al.

(10) Patent No.: US 6,534,350 B2
(45) Date of Patent: Mar. 18, 2003

(54) METHOD FOR FABRICATING A LOW TEMPERATURE POLYSILICON THIN FILM TRANSISTOR INCORPORATING CHANNEL PASSIVATION STEP

(75) Inventors: Chih-Chiang Chen, Hsinchu (TW); Kun-Chih Lin, Hsinchu (TW); Chung-Shu Chang, Chutung (TW); Wen-Yu Huang, Chutung (TW); Pi-Fu Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/920,877

(22) Filed: Aug. 2, 2001

(65) Prior Publication Data

US 2003/0027412 A1 Feb. 6, 2003

(51) Int. Cl.$^7$ ................................................. H01L 21/00
(52) U.S. Cl. ........................ 438/163; 438/164; 438/166; 438/491; 438/529; 438/532
(58) Field of Search ................................. 438/149–166, 438/514–534, 491

(56) References Cited

U.S. PATENT DOCUMENTS

| | | | |
|---|---|---|---|
| 5,328,861 A | * 7/1994 | Miyakawa | 438/151 |
| 5,365,080 A | * 11/1994 | Yamazaki et al. | 257/66 |
| 5,904,508 A | * 5/1999 | Codama et al. | 438/151 |
| 6,287,898 B1 | * 9/2001 | Sera | 438/149 |
| 2001/0031519 A1 | * 10/2001 | Ayres et al. | 438/149 |
| 2002/0004260 A1 | * 1/2002 | Furuta et al. | 438/149 |

* cited by examiner

Primary Examiner—Amir Zarabian
Assistant Examiner—Jeff Vockrodt
(74) Attorney, Agent, or Firm—Tung & Associates

(57) ABSTRACT

A method for fabricating a low temperature polysilicon thin film transistor incorporating a channel passivation step is described. The method achieves dopant ion activation in a polysilicon gate by using laser irradiation, however, with an additional insulating material layer such as $SiO_x$ or $Si_xN_y$ overlying and protecting the channel portion of the polysilicon gate. Any possible contamination by residual photoresist material after a photoresist removal step on the channel portion of the polysilicon gate can thus be avoided. Furthermore, deficiencies such as dopant ions out-diffusion and lateral diffusion can be avoided. The leakage current of the thin film transistors formed by the present invention method is significantly reduced when compared to those formed by a conventional method.

19 Claims, 3 Drawing Sheets

METHOD FOR FABRICATING A LOW TEMPERATURE POLYSILICON THIN FILM TRANSISTOR INCORPORATING CHANNEL PASSIVATION STEP

FIELD OF THE INVENTION

The present invention generally relates to a method for fabricating a thin film transistor and more particularly, relates to a method for fabricating a low temperature polysilicon thin film transistor that incorporates a channel passivation step such that a laser activation step for the dopant ions does not cause any property degradation.

BACKGROUND OF THE INVENTION

In recent years, large liquid crystal cells have been used in flat panel displays. The liquid crystal cells are normally constructed by two glass plates joined together with a layer of a liquid crystal material sandwiched in-between. The glass substrates have conductive films coated thereon with at least one of the substrates being transparent. The substrates are connected to a source of power to change the orientation of the liquid crystal material. A possible source of power is a thin film transistor that is used to separately address areas of the liquid crystal cells at very fast rates. The TFT driven liquid crystal cells can be advantageously used in active matrix displays such as for television and computer monitors.

As the requirements for resolution of liquid crystal monitors increase, it becomes desirable to address a large number of separate areas of a liquid crystal cell, called pixels. For instance, in a modern display panel, more than 3,000,000 pixels may be present. At least the same number of transistors must therefore be formed on the glass plates so that each pixel can be separately addressed and left in the switched state while other pixels are addressed.

Thin film transistors are frequently made with either a polysilicon material or an amorphous silicon material. For TFT structures that are made of amorphous silicon material, a common structure is the inverted staggered type which can be back channel etched or tri-layered. The performance of a TFT and its manufacturing yield or throughput depend on the structure of the transistor. For instance, the inverted staggered back channel etched TFT can be fabricated with a minimum number of six masks, whereas other types of inverted staggered TFT require a minimum number of nine masks. The specification for a typical inverted staggered back channel etched TFT includes an amorphous silicon that has a thickness of 3,000 Å, a gate insulator of silicon nitride or silicon oxide, a gate line of Mo/Ta, a signal line of Al/Mo and a storage capacitor. The requirement of a thick amorphous silicon layer in the TFT device is a drawback for achieving a high yield fabrication process since deposition of amorphous silicon is a slow process. A major benefit for the amorphous silicon TFT is its low leakage current which enables a pixel to maintain its voltage. On the other hand, an amorphous silicon TFT has the drawback of a low charge current (or on current) which requires an excessive amount of time for a pixel to be charged to its required voltage.

FIG. 1 shows an enlarged, cross-sectional view of a conventional amorphous silicon TFT structure. Amorphous TFT 10 is built on a low cost glass substrate 12. On top of the glass substrate 12, a gate electrode 14 is first deposited of a refractory metal such as Cr, Al or Al alloy and then formed. A gate insulating layer 16 is normally formed in an oxidation process. For instance, a high density $TaO_x$ on a Ta gate can be formed to reduce defects such as pin holes and to improve yield. Another gate insulating layer 20 is then deposited of either silicon oxide or silicon nitride. An intrinsic amorphous silicon layer 22 is then deposited with a $n^+$ doped amorphous silicon layer 24 deposited on top to improve its conductivity. Prior to the deposition of the doped amorphous silicon layer 24, an etch stop 26 is first deposited and formed to avoid damages to the amorphous silicon layer 22 in a subsequent etch process for a contact hole. The doped amorphous silicon layer 24 is formed by first depositing the amorphous silicon layer in a chemical vapor deposition process and then implanting ions in an ion implantation process. Boron ions are normally used to achieve $n^+$ polarity. A drain region 30 and a source region 32 are then deposited and formed with a pixel electrode layer 34 of ITO (indium-tin-oxide) material deposited and formed on top. The drain region 30 and the source region 32 are normally deposited of a conductive metal layer. A suitable conductive metal may be a bilayer of Cr/Al. The structure is then passivated with a passivation layer 36.

A second conventional inverted staggered type TFT 40 is shown in FIG. 2. The TFT 40 is frequently called the back channel etched type inverted staggered TFT. A gate electrode 42 is first formed on a non-conducting glass substrate 38. The gate electrode 42 is connected to a gate line (not shown) laid out in the row direction. A dielectric material layer 44 of either silicon oxide or silicon nitride is used to insulate the gate electrode 42. After an amorphous silicon layer 46 and a contact layer 48 are sequentially deposited, patterned and etched, source electrode 50 and drain electrode 52 are formed to provide a channel 54 in-between the two electrodes, hence the name back channel etched TFT. The source electrode 50 of each TFT is connected to a transparent pixel electrode 56 independently formed in the area surrounded by the gate lines and the drain lines (not shown). A transparent passivation layer 58 of a material such as silicon nitride is deposited on the completed structure.

As shown in FIG. 2, the gate electrode 42 is frequently formed of chromium or other similar metals on the transparent glass substrate 38. The dielectric layer 44 of gate oxide or silicon nitride is formed to insulate the upper surface of the glass substrate 38 including the top surface of the gate electrode 42. A semi-conducting layer 46, which may be formed of amorphous silicon is stacked on the dielectric film 44 over the gate electrode 42. The drain electrode 52 and the source electrode 50 are formed on the semi-conducting film 46 and are separated from each other by a predetermined distance forming the channel section 54. The two electrodes each has a contact layer of 48 and a metal layer which are electrically connected to the semi-conducting layer 46. The transparent electrode 44 may be formed of ITO.

A second type of TFT is made by using a polysilicon material. Polysilicon is more frequently used for displays that are designed in a smaller size, for instance, up to three inch diagonal for a projection device. At such a small size, it is economical to fabricate the display device on a quartz substrate. Unfortunately, large area display devices cannot be made on quartz substrates. The desirable high performance of polysilicon can be realized only if a low temperature process can be developed to enable the use of non-quartz substrates. For instance, in a recently developed process, large area polysilicon TFT can be manufactured at processing temperatures of less than 600° C. In the process, self-aligned transistors are made by depositing polysilicon and gate oxide followed by source/drain regions which are self-aligned to the gate electrode. The device is then completed with a thick oxide layer, an ITO layer and aluminum contacts.

Polysilicon TFTs have the advantage of a high charge current (or on current) and the drawback of a high leakage current. It is difficult to maintain the voltage in a pixel until the next charge in a polysilicon TFT due to its high leakage current. Polysilicon also allows the formation of CMOS devices, which cannot be formed by amorphous silicon. For the fabrication of larger displays, a higher mobility may be achieved by reducing the trap density around the grain boundaries in a hydrogenation process.

When compared to the amorphous silicon thin film transistors, the low temperature polysilicon TFTs have higher mobility and higher drive current. However, due to the fabrication technology and the structure of the polysilicon element, the activation process (or the annealing process) for the dopant ions in the source area and the drain area has become an important issue. For instance, FIG. 3 illustrates a conventional method for an activation process for a polysilicon island 60. The polysilicon island 60 is constructed by a polysilicon layer 62 with a photoresist layer 64 patterned on top to cover a channel section 66 of the polysilicon island 62. However, in this conventional method for activating the dopant ions, i.e. $N^+$ dopant ions by either laser irradiation or by rapid thermal annealing (RTA), several process disadvantages have been encountered. For instance, a direct contact of the photoresist layer 64 with the polysilicon layer 62 causes contamination to the polysilicon by residual photoresist material left behind after a photoresist removal process. Moreover, other processing difficulties such as dopant out-diffusion and dopant lateral diffusion have been encountered. The conventional method for dopant activation, therefore, must be improved before it can be used to produce high quality thin film transistors.

It is therefore an object of the present invention to provide a method for fabricating a low temperature polysilicon thin film transistor that does not have the drawbacks or the shortcomings of the conventional method.

It is another object of the present invention to provide a method for fabricating a low temperature polysilicon thin film transistor that incorporates multi-layer channel passivation step.

It is a further object of the present invention to provide a method for fabricating a low temperature polysilicon thin film transistor in which dopant ions are activated by laser irradiation without causing damages to a channel region.

It is another further object of the present invention to provide a method for activating dopant ions in a polysilicon gate in a thin film transistor by depositing a multi-layer passivation layer on top of a channel region of a polysilicon gate prior to a laser activation step.

It is still another object of the present invention to provide a method for activating dopant ions in a polysilicon gate in a TFT by first depositing a first insulating material layer, a metal layer and a second insulating material layer on top of a polysilicon gate to shield a channel region during a laser activation process.

It is yet another object of the present invention to provide a method for activating dopant ions in a polysilicon gate in a TFT structure wherein dopant ions in both a NMOS and a PMOS are activated simultaneously in the same step.

SUMMARY OF THE INVENTION

In accordance with the present invention, a method for activating dopant ions in a polysilicon gate of a thin film transistor is provided.

In a preferred embodiment, a method for activating dopant ions in a polysilicon gate in a thin film transistor can be carried out by the operating steps of providing a substrate; forming a polysilicon island on the substrate; depositing an insulating material layer overlying the polysilicon island; depositing a photoresist layer on top of the insulating material layer without contacting the polysilicon island and patterning the photoresist layer to overlie only a channel area in the polysilicon island; etching away the insulating material layer except an area covered by the patterned photoresist layer; doping by implantation $N^+$ dopant ions into the polysilicon island except the area covered by the patterned photoresist layer; and activating the N+ dopant ions in the polysilicon island by laser irradiation through the remaining insulating material layer situated on top.

The method for activating dopant ions in a polysilicon gate in a TFT may further include the step of depositing the insulating material layer of a material selected from the group consisting of $SiO_x$, $Si_xN_y$, and SiON. The method may further include the step of depositing the insulating material layer by a method of plasma enhanced chemical vapor deposition or a method of spin-on coating. The method may further include the step of depositing the insulating material layer to a thickness between about 100 Å and about 1500 Å, and preferably to a thickness between about 500 Å and about 1000 Å. The method may further include the step of activating the $N^+$ dopant ions by scanning the polysilicon island with an excimer laser, or the step of forming a gate insulator layer on top of the polysilicon island after the activation step. The method may further include the steps of forming a gate insulator layer on top of the polysilicon island, and forming a metal gate on top of the gate insulator layer after the activation step for the polysilicon island. The activation step for the dopant ions may be an annealing step.

The present invention is further directed to a method for fabricating a low temperature polysilicon TFT which can be carried out by the operating steps of providing a substrate; forming a polysilicon island on the substrate; depositing an insulating material layer overlying the polysilicon island; depositing a first photoresist layer on top of the insulating material layer without contacting the polysilicon island and patterning the first photoresist layer to overlie only a channel portion in the polysilicon island; etching away the insulating material layer except an area covered by the patterned first photoresist layer; doping by implanting $N^+$ dopant ions into the polysilicon island except the area covered by the patterned first photoresist layer; activating the $N^+$ dopant ions in the polysilicon island by laser irradiation through the remaining insulating material layer situated on top; removing the remaining insulating material layer; depositing a gate oxide layer and a metal layer sequentially on top of the polysilicon island; patterning a metal gate from the metal layer by a second photoresist layer; and forming $N^-$ doped region in the polysilicon island through the patterned second photoresist layer.

The method for fabricating a low temperature polysilicon TFT may further include the step of forming lightly doped drain (LDD) regions in the substrate. The method may further include the step of depositing the insulating material layer of a material selected from the group consisting of $SiO_x$, $Si_xN_y$ and SiON. The method may further include the step of depositing the insulating material layer by PECVD or by spin-on coating. The thickness of the insulating material layer deposited is in the range between about 100 Å and about 1500 Å, and preferably between about 500 Å and about 1000 Å. The method may further include the step of activating the $N^+$ dopant ions by scanning the polysilicon island with an excimer laser.

The present invention is still further directed to a method for forming a polysilicon gate in a TFT incorporating a channel passivation step which can be carried out by first forming a polysilicon island on a substrate; depositing a passivation layer overlying the polysilicon island; patterning a photoresist layer on the passivation layer to overlap only a channel portion in the polysilicon gate; implanting $N^+$ dopant ions into the polysilicon gate except the channel portion; irradiating the polysilicon island through the passivation layer with laser energy to activate the $N^+$ dopant ions; removing the passivation layer from and forming a gate oxide and metal gate on the polysilicon island; and implanting $N^-$ dopant ions into the polysilicon island and forming LDD structure.

The method for forming a polysilicon gate in a TFT structure incorporating a channel passivation step may further include the step of forming the passivation layer from a material selected from the group consisting of $SiO_x$, $Si_xN_y$ and SiON. The method may further include the step of depositing the passivation layer to a thickness between about 500 Å and about 1000 Å by a technique of PECVD or spin-on coating.

BRIEF DESCRIPTION OF THE DRAWINGS

These and other objects, features and advantages of the present invention will become apparent from the following detailed description and the appended drawings in which.

DETAILED DESCRIPTION OF THE PREFERRED AND ALTERNATE EMBODIMENT

Figure 1:
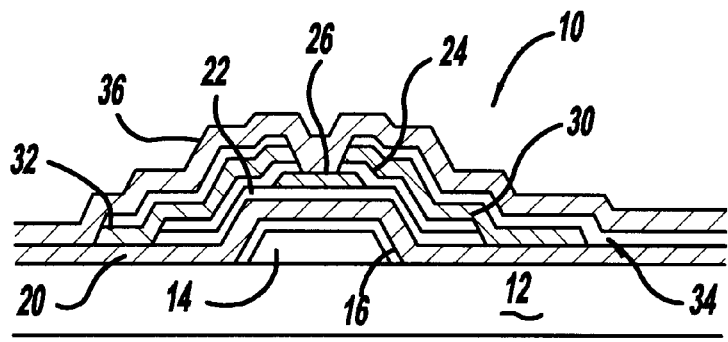
FIG. 1 is an enlarged, cross-sectional view of a conventional inverted staggered TFT of the tri-layered type.
Figure 2:
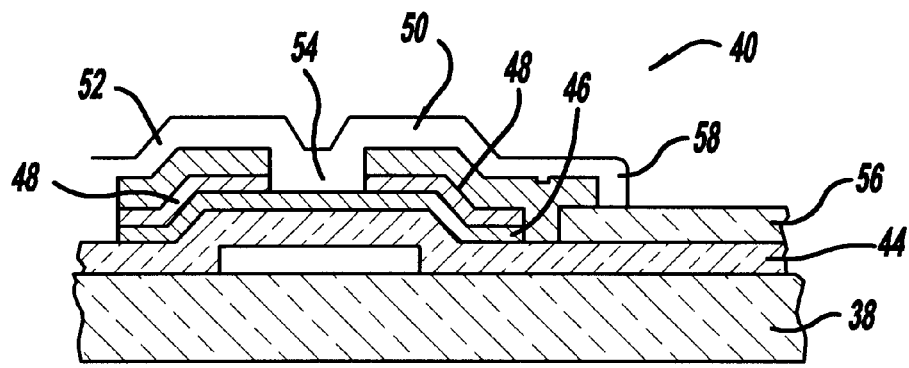
FIG. 2 is an enlarged, cross-sectional view of a conventional inverted staggered TFT of the back channel-etched type.
Figure 3:
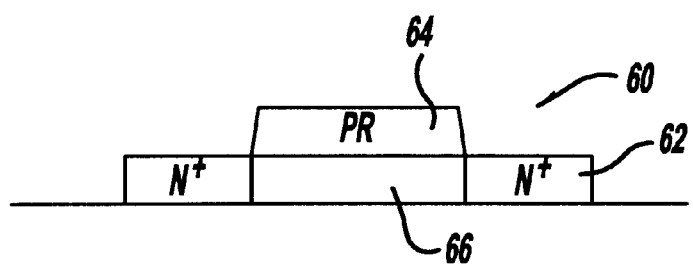
FIG. 3 is an enlarged, cross-sectional view of a conventional method for activating dopant ions in a polysilicon gate by directly depositing a photoresist layer on top of the polysilicon gate.

The present invention discloses a method for fabricating a low temperature polysilicon thin film transistor that incorporates a channel passivation step, in particular, the method discloses a method for activating dopant ions in a polysilicon gate of a thin film transistor that does not have the drawbacks or the shortcomings of the conventional activation methods.

The method for activating dopant ions in a polysilicon gate of a thin film transistor can be practiced by first providing a substrate, then forming polysilicon islands on the substrate. An insulating material layer is then deposited to overlie the polysilicon island, followed by the deposition of a photoresist layer on top of the insulating material layer. One of the major advantages of the present invention is made possible by the fact that the photoresist layer does not contact directly the polysilicon island and thus, any possible contamination by residual photoresist material after a removal process can be avoided. The photoresist layer is then patterned to overlie only a channel portion in the polysilicon island. After the insulating material layer is etched away in areas except that covered by the patterned photoresist layer, dopant ions of $N^+$ origin are implanted into the polysilicon island except where covered by the patterned photoresist layer. The $N^+$ dopant ions are then activated by laser irradiation through the remaining insulating material layer that still covers the channel portion of the polysilicon island.

A suitable insulating material layer to be used in the present invention method may be selected from $SiO_x$, $Si_xN_y$ and SiON. The deposition of the insulating material layer may be carried out by either a plasma enhanced chemical vapor deposition method or a spin-on coating method. A suitable thickness of the insulating material layer coated can be between about 100 Å and about 1500 Å, and preferably between about 500 Å and about 1000 Å.

The invention further discloses a method for fabricating a low temperature polysilicon thin film transistor that has improved electrical properties. The method can be carried out by first preparing a polysilicon gate in a TFT structure wherein dopant ions are activated by laser irradiation as previously described. The method is then followed by the steps of removing the remaining insulating material layer, and depositing a gate oxide layer and a metal layer sequentially on top of the polysilicon island. A metal gate is then patterned from the metal layer by using a second photoresist layer. $N^-$ doped regions are then formed in the polysilicon island through the patterned second photoresist layer, followed by the formation of lightly doped drain (LDD) regions in the substrate.

The invention still further discloses a method for forming a polysilicon gate in a TFT structure that incorporates a channel passivation step which can be carried out by first forming a polysilicon island on a substrate, followed by the deposition of a passivation layer of an insulating material overlying the polysilicon island. A photoresist layer is then patterned on the passivation layer to overlap only a channel portion in the polysilicon gate, followed by implanting $N^+$ dopant ions into the polysilicon gate except the channel portion. The polysilicon island is then irradiated by laser through the passivation layer to activate the $N^+$ dopant ions. The final steps of the process include the removal of the passivation layer from the polysilicon island and the formation of a gate oxide and a metal gate on top of the island, and the implantation of $N^-$ dopant ions into the polysilicon island to form LDD structure.

In the present invention novel method, wherein a channel passivation technique is used to reduce or eliminate any damages caused by either laser irradiation or by rapid thermal annealing. For instance, defects such as dopant out-diffusion and lateral diffusion can be greatly reduced. Furthermore, by the introduction of the channel passivation layer, the channel portion of the polysilicon island is not in direct contact with a photoresist layer during the processes. Any contamination to the channel portion of the polysilicon gate can thus be avoided. As a result, the characteristics of the TFT and the fabrication yield of the process can both be improved.

Figure 4A:
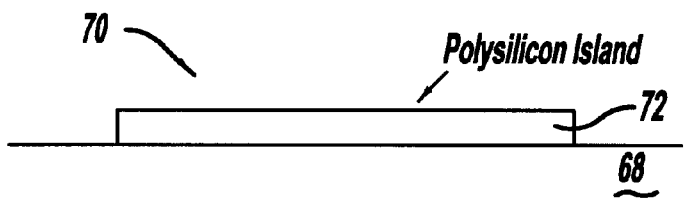
FIG. 4A is an enlarged, cross-sectional view of the present invention structure illustrating the formation of a polysilicon island on a substrate.
Figure 4B:
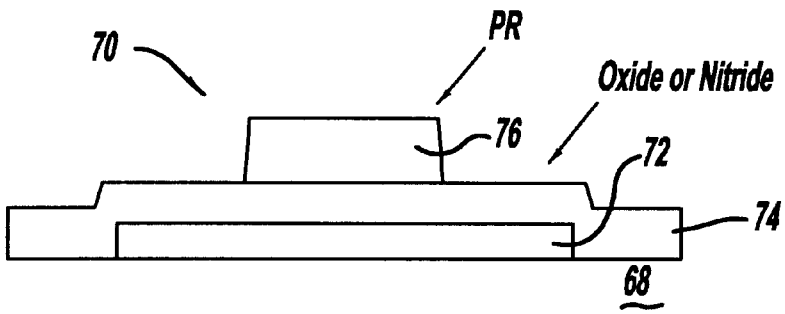
FIG. 4B is an enlarged, cross-sectional view of the present invention structure of FIG. 4A with an insulating material layer deposited on top of the polysilicon island and a photoresist film patterned on top of the insulating material layer.

Referring now to FIGS. 4A–4E, wherein the fabrication process for the present invention TFT 70 is shown. In the first step, as shown in FIG. 4A, a polysilicon island 72 is deposited and patterned on a substrate 68. An insulating material layer 74, i.e. the channel passivation layer, is then deposited overlying the polysilicon island 72. A photoresist layer 76 is then deposited and patterned only to overlap an area for the channel portion 78 of the polysilicon island 72.

Figure 4C:
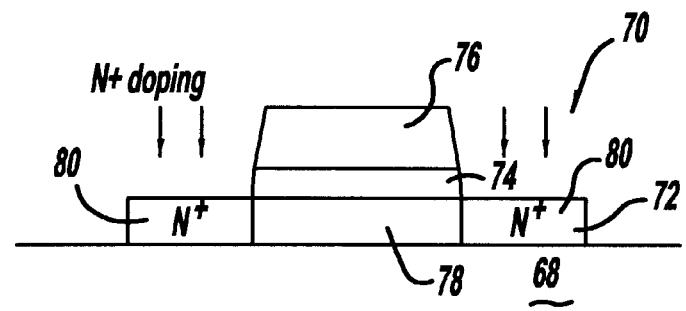
FIG. 4C is an enlarged, cross-sectional view of the present invention thin film transistor structure of FIG. 4B with the insulating material layer formed by the photoresist layer and the $N^+$ dopant ions activated by laser irradiation.
Figure 4D:
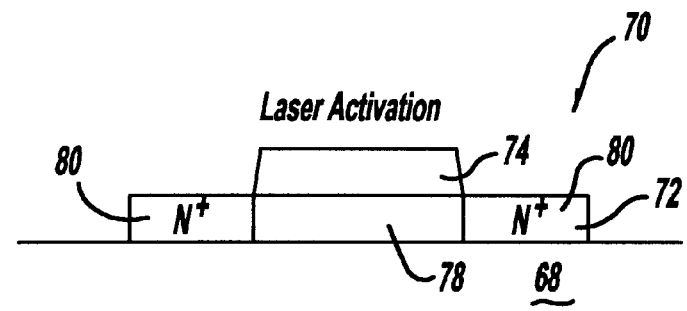
FIG. 4D is an enlarged, cross-sectional view of the present invention TFT structure of FIG. 4C with the photoresist layer removed.

In the next step, as shown in FIG. 4C, the insulating material layer 74 is formed with areas not covered by the photoresist layer 76 etched away followed by an $N^+$ doping process wherein $N^+$ dopant ions are implanted into the edge portion 80 of the polysilicon island 72. The edge portion 80 is defined as the portion that is not the channel portion 78. The $N^+$ doping process can be carried out by any one of possible dopant ions that are well-known in the art.

Figure 4E:
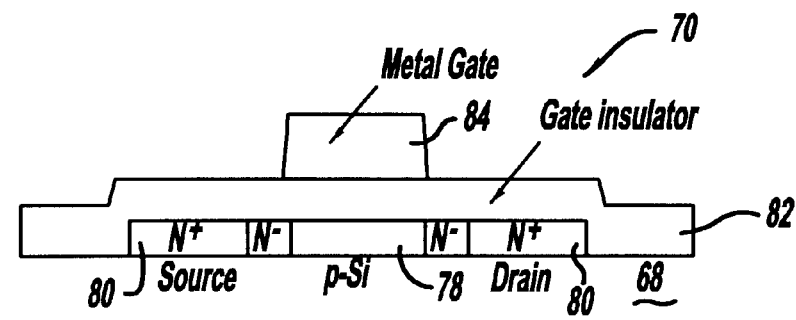
FIG. 4E is an enlarged, cross-sectional view of the present invention TFT structure of FIG. 4D with the insulating material layer removed, a gate insulator layer deposited, and a metal gate deposited and formed on top of the gate insulator layer.

In the next step of the process for laser activation, the activation process is conducted with an insulating material layer 74 protecting, i.e. overlying the channel portion 78. This enables the achievement of some of the present invention advantages of keeping the channel portion 78 from contamination and from other undesirable degradation in its electronic properties. After the laser irradiation process is carried out by scanning with a pulse laser of the excimer type, the insulating material layer 74 is removed. This is shown in FIG. 4E. The process can then be continued by depositing and forming a gate insulator 82 on top and overlying the polysilicon island 72, followed by the formation of a metal gate 84 on top of the gate insulator 82.

Figure 5:
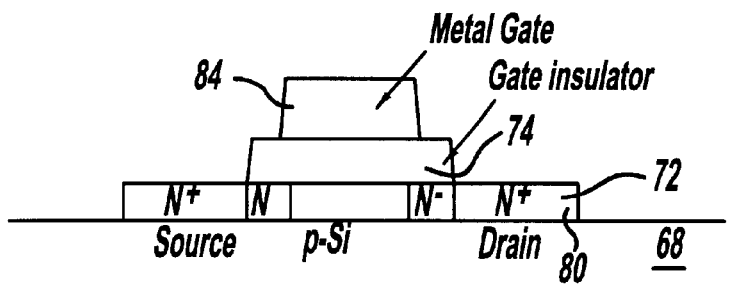
FIG. 5 is an enlarged, cross-sectional view of a first alternate embodiment of the present invention.
Figure 6:
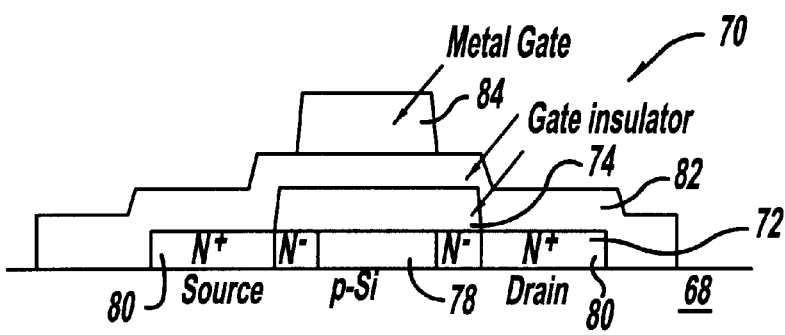
FIG. 6 is an enlarged, cross-sectional view of a second alternate embodiment of the present invention.

In another alternate embodiment, shown in FIG. 5, the gate insulator layer 74 is not removed. The metal gate 84 is then directly deposited and patterned on top of the insulating material layer 74. In this configuration, the step for removing the insulating material layer 74 can be saved and furthermore, the step of redepositing a gate insulator layer 82 can also be saved.

In a second alternate embodiment, the original insulating material layer 74 is saved with a new gate insulator layer 82 deposited on top. A metal gate 84 is then deposited on top of the second gate insulator layer 82. This alternate embodiment provides the benefit of additional protection by the two insulating material layers 74 and 82.

Figure 7:
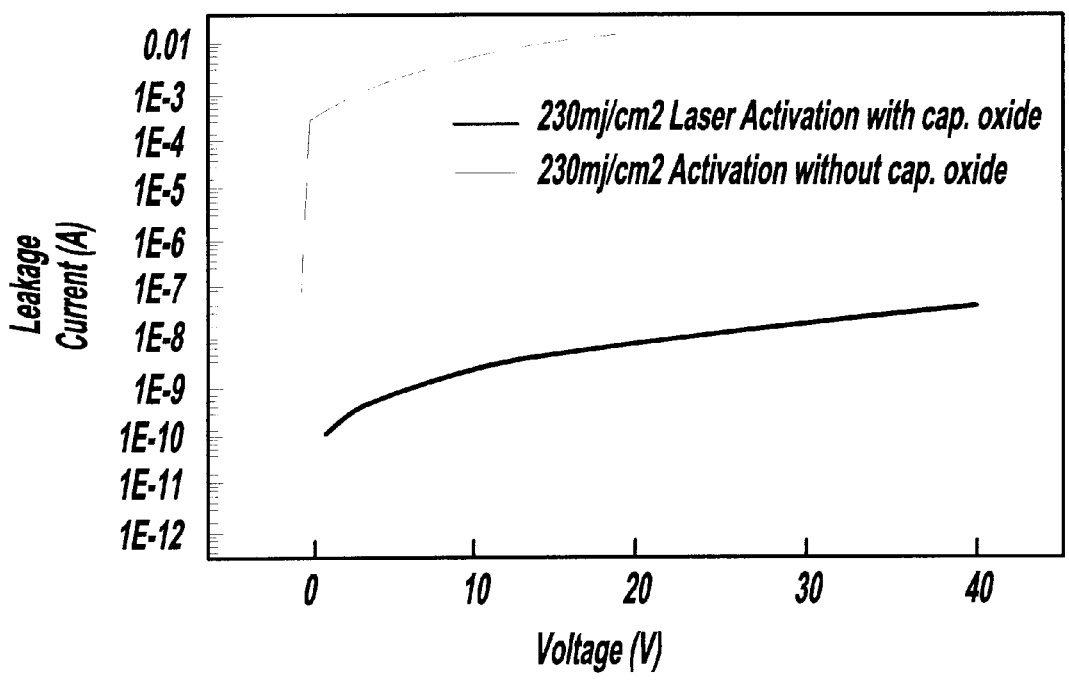
FIG. 7 is a graph illustrating the dependency of leakage current on the drive voltage illustrating a significant improvement in the TFT structure form ed by the present invention method.

The effectiveness of the present invention novel method can be seen in FIG. 7 of a graph plotted of leakage current against the voltage. It is seen that the solid line which represents TFT structures obtained by using the present invention channel passivation method, while the dashed line represents TFT structures obtained by the conventional method without using the cap oxide layer, i.e. the channel passivation layer. A significant reducing in the leakage current, i.e. by an order of $10^6$, can be seen from FIG. 7.

The present invention novel method for fabricating a low temperature polysilicon thin film transistor by incorporating a channel passivation step has therefore been amply described in the above description and in the appended drawings of FIGS. 4A–7.

While the present invention has been described in an illustrative manner, it should be understood that the terminology used is intended to be in a nature of words of description rather than of limitation.

Furthermore, while the present invention has been described in terms of one preferred and two alternate embodiments, it is to be appreciated that those skilled in the art will readily apply these teachings to other possible variations of the inventions.

The embodiment of the invention in which an exclusive property or privilege is claimed are defined as follows.

What is claimed is:

1. A method for activating dopant ions in a polysilicon thin film transistor (TFT) comprising the steps of:
   providing a substrate;
   forming a polysilicon island on said substrate;
   depositing an insulating material layer overlying said polysilicon island;
   depositing a photoresist layer on top of said insulating material layer without contacting said polysilicon island and patterning said photoresist layer to overlie only a channel portion in said polysilicon island;
   etching away, optionally, said insulating material layer except an area covered by said patterned photoresist layer;
   doping by implanting $N^+$ dopant ions in said polysilicon island and activating the implanted dopant ions by laser irradiation through said remaining insulating material layer situated on top;
   forming a gate insulator layer on top of said polysilicon island; and
   forming a metal gate on top of said gate insulator layer after said activation step for said polysilicon island.

2. A method for activating dopant ions in a polysilicon TFT according to claim 1 further comprising the step of depositing said insulating material layer of a material selected from the group consisting of $SiO_x$, $Si_xN_y$, and $SiON$.

3. A method for activating dopant ions in a polysilicon TFT according to claim 1 further comprising the step of depositing said insulating material layer by a method of plasma enhanced chemical vapor deposition or a method of spin-on coating.

4. A method for activating dopant ions in a polysilicon TFT according to claim 1 further comprising the step of depositing said insulating material layer to a thickness between about 100 Å and about 1500 Å.

5. A method for activating dopant ions in a polysilicon TFT according to claim 1 further comprising the step of depositing said insulating material layer preferably to a thickness between about 500 Å and about 1000 Å.

6. A method for activating dopant ions in a polysilicon TFT according to claim 1 further comprising the step of activating said $N^+$ dopant ions by scanning said polysilicon island with an excimer laser.

7. A method for activating dopant ions in a polysilicon TFT according to claim 1 further comprising the step of forming a gate insulator layer on top of said polysilicon island after said activation step.

8. A method for activating dopant ions in a polysilicon TFT according to claim 1, wherein said activation step is an annealing step.

9. A method for fabricating a low temperature polysilicon TFT comprising the steps of:
   providing a substrate;
   forming a polysilicon island on said substrate;
   depositing an insulating material layer overlying said polysilicon island;

depositing a photoresist layer on top of said insulating material layer without contacting said polysilicon island and patterning said photoresist layer to overlie only a channel portion in said polysilicon island;

etching away said insulating material layer except an area covered by said patterned photoresist layer;

doping by implanting $N^+$ dopant ions in said polysilicon island and activating the implanted dopant ions by laser irradiation through said remaining insulating material layer situated on top;

removing said remaining insulating material layer;

depositing a gate oxide layer and a metal layer sequentially on top of said polysilicon island;

patterning a metal gate from said metal layer by a second photoresist layer; and forming $N^-$ doped region in said polysilicon island through said patterned second photoresist layer.

10. A method for fabricating a low temperature polysilicon TFT according to claim 9 further comprising the step of forming lightly doped drain (LDD) regions in said substrate.

11. A method for activating dopant ions in a low temperature polysilicon TFT according to claim 9 further comprising the step of depositing said insulating material layer of a material selected from the group consisting of $SiO_x$, $Si_xN_y$ and SiON.

12. A method for activating dopant ions in a low temperature polysilicon TFT according to claim 9 further comprising the step of depositing said insulating material layer by a method of plasma enhanced chemical vapor deposition or a method of spin-on coating.

13. A method for activating dopant ions in a low temperature polysilicon TFT according to claim 9 further comprising the step of depositing said insulating material layer to a thickness between about 100 Å and about 1500 Å.

14. A method for activating dopant ions in a low temperature polysilicon TFT according to claim 9 further comprising the step of depositing said insulating material layer preferably to a thickness between about 500 Å and about 1000 Å.

15. A method for activating dopant ions in a low temperature polysilicon TFT according to claim 9 further comprising the step of activating said $N^+$ dopant ions by scanning said polysilicon island with an excimer laser.

16. A method for forming a polysilicon TFT incorporating a channel passivation step comprising the step of:

forming a polysilicon island on a substrate;

depositing a passivation layer overlying said polysilicon island;

patterning a photoresist layer on said passivation layer to overlap only a channel portion in said polysilicon island;

implanting $N^+$ dopant ions into said polysilicon island except said channel portion;

irradiating said polysilicon island through said passivation layer with laser energy to activate said $N^+$ dopant ions;

removing said passivation layer from and forming a gate oxide and metal gate on said polysilicon island; and implanting $N^-$ dopant ions into said polysilicon island and forming LDD structure.

17. A method for forming a polysilicon TFT incorporating a channel passivation step according to claim 16 further comprising the step of forming said passivation layer from a material selected from the group consisting of $SiO_x$, $Si_xN_y$ and SiON.

18. A method for forming a polysilicon TFT incorporating a channel passivation step according to claim 16 further comprising the step of depositing said passivation layer to a thickness between about 500 Å and about 1000 Å.

19. A method for forming a polysilicon TFT incorporating a channel passivation step according to claim 16 further comprising the step of depositing said passivation layer by a plasma enhanced CVD technique or a spin-on coating technique.

* * * * *